US006380479B2

(12) United States Patent
Nakai et al.

(10) Patent No.: US 6,380,479 B2
(45) Date of Patent: *Apr. 30, 2002

(54) PHOTOVOLTAIC ELEMENT AND METHOD FOR MANUFACTURE THEREOF

(75) Inventors: Takuo Nakai; Hiroyuki Taniguchi, both of Osaka; Teruhiko Ienaga, Hirakata; Yasuo Kadonaga, Osaka, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/813,296

(22) Filed: Mar. 21, 2001

Related U.S. Application Data

(63) Continuation of application No. 09/355,311, filed as application No. PCT/US98/01204 on Mar. 19, 1998, now Pat. No. 6,207,890.

(30) Foreign Application Priority Data

Mar. 21, 1997 (JP) ................................. 9-67690

(51) Int. Cl.⁷ .............................................. H01L 25/00
(52) U.S. Cl. ........................................ 136/246; 136/256
(58) Field of Search .................................. 136/246, 256

(56) References Cited

U.S. PATENT DOCUMENTS

| 4,253,882 A | | 3/1981 | Dalal ........................ 136/249 |
| 4,644,091 A | | 2/1987 | Hayashi et al. ............. 136/259 |
| 4,767,336 A | * | 8/1988 | Yamazaki ................... 136/256 |
| 4,956,685 A | * | 9/1990 | Fischer et al. .............. 136/256 |
| 5,704,992 A | * | 1/1998 | Willeke et al. ............. 136/256 |
| 6,207,890 B1 | * | 3/2001 | Nakai et al. ................ 136/246 |

FOREIGN PATENT DOCUMENTS

| JP | 59-14682 | 1/1984 |
| JP | 59-123283 | 7/1984 |
| JP | 59-175170 | 10/1984 |
| JP | 60-63968 | 4/1985 |
| JP | 61-290712 | 12/1986 |
| JP | 3-70183 | 3/1991 |
| JP | 3-71677 | 3/1991 |
| JP | 3-276682 | 12/1991 |
| JP | 4-139769 | 5/1992 |
| JP | 7-202232 | 8/1995 |
| JP | 8-78710 | 3/1996 |
| JP | 8-162656 | 6/1996 |
| JP | 9-69643 | 3/1997 |

OTHER PUBLICATIONS

Article entitled "Optical Reflectance Reduction of Textured Silicon Surfaces Coated with An Antireflective Thin Film" by Edward S. Kolesar, Jr., Victor M. Bright, and David M. Sowders dated Dec. 15, 1996.

* cited by examiner

Primary Examiner—Mark Chapman
(74) Attorney, Agent, or Firm—Arent Fox Kintner Plotkin & Kahn

(57) ABSTRACT

A photovoltaic element which directly converts an optical energy such as solar light into an electric energy. After many uneven sections are formed on the surface of an n-type crystalline silicon substrate (1), the surface of the substrate (1) is isotropically etched. Then the bottoms (b) of the recessed sections are rounded and a p-type amorphous silicon layer (3) is formed on the surface of the substrate (1) through an intrinsic amorphous silicon layer (2). The shape of the surface of the substrate (1) after isotropic etching is such that the bottoms of the recessed sections are slightly rounded and therefore the amorphous silicon layer can be deposited in a uniform thickness.

21 Claims, 6 Drawing Sheets

US 6,380,479 B2

PHOTOVOLTAIC ELEMENT AND METHOD FOR MANUFACTURE THEREOF

This is a continuation of application Ser. No. 09/355,311 filed Jul. 29, 1999, now U.S. Pat. No. 6,207,890, which is a 371 of PCT/JP98/01204, filed Mar. 19, 1998. The disclosure of the prior application(s) is hereby incorporated by reference herein in its entirety.

FIELD OF THE INVENTION

This invention is related to a photovoltaic element for directly converting an optical energy such as solar light into an electric energy and a method for manufacturing the same.

BACKGROUND OF THE INVENTION

A heterojunction type photovoltaic element, in which an amorphous silicon layer or a micro crystalline silicon layer are deposited on a single crystalline silicon substrate, is well-known. The heterojunction can have its distinguish function when an impurity is doped on an amorphous silicon layer or a micro crystalline silicon layer.

In the amorphous silicon layer or mircocrystalline silicon layer which is doped, however, defects caused by doping increase and the characteristic of the heterojunction interface is degraded. The degradation of the interface characteristic results in a lower conversion efficiency because of a recombination of carriers in the case where these silicon layers are used for a photovoltaic element.

To overcome this problem, Japanese Patent Laid-Open No.70183/1991 (IPC:H01L 31/04) has proposed a photovoltaic element in which the heterojunction interface characteristic is improved by interposing a substantially intrinsic amorphous silicon layer between a single crystalline silicon substrate and an amorphous silicon layer for the purpose of decreasing defects at the interface.

In a conventional photovoltaic element, many uneven sections of line- or lattice-shape etc. are formed on a surface of a substrate by such processes as etching which uses resist, or anisotropic etching which employs alkaline solutions such as potassium hydroxide (KOH) or sodium hydroxide (NaOH) solutions or mechanical groove in order to improve short circuit current brought by the optical confinement effect.

FIG. 11 illustrates a structure of a photovoltaic element having the optical confinement which improves the heterojunction interface characteristic (hereinafter it is referred as an HIT structure). As shown in FIG. 11, an intrinsic amorphous silicon layer 2 is formed on an n-type crystalline silicon substrate 1 of which front surface has many uneven sections. A p-type amorphous silicon layer 3 is formed on the intrinsic amorphous silicon layer 2. A front electrode 4 is formed on the whole region of the p-type amorphous silicon layer 3 and a comb-like collecting electrode 5 is formed on the front electrode 4. A back electrode 6 is formed on the back surface of the substrate 1.

Although the comb-like collecting electrode 5 appears to be formed on the top of the pyramid-shape protruded section in FIG. 11, the actual width of the comb-like collecting electrode 5 is no less than 100 μm. To help an understanding about the notion of the comb-like collecting electrode 5, the figure describes the electrode appears to be formed only on the top of the pyramid-shape protruded section. The actual comb-like collecting electrode 5 has a width equivalent to ten to twenty protruded sections of pyramid-shape.

In the above described conventional structure of the front surface of the substrate 1, a problem may occur when the intrinsic amorphous silicon layer 2 is formed on the substrate 1 by a plasma CVD method. When an amorphous semiconductor layer such as amorphous silicon is formed by a plasma CVD method, the thickness of amorphous semiconductor layer may not be uniform in the top a, the bottom b of the uneven section on the front surface, and the plain surface between a and b. As the thickness of the amorphous semiconductor film on the top a is thick and thin on the bottom b, particularly the amorphous semiconductor film may not be sufficiently deposited at the bottom b. In FIG. 11, the intrinsic amorphous silicon layer 2 and the p-type amorphous silicon layer 3 become thin at the bottom b, and it causes a lower open circuit voltage and short circuit between the electrode and the substrate, resulting in extremely degraded output characteristic of a photovoltaic element.

This invention has an objective to provide a photovoltaic element which solves the conventional problem as described above and improve an output characteristic and yields, and a method for manufacturing the same.

DESCLOSURE OF THE INVENTION

An amorphous or micro crystalline silicon layer on a crystalline silicon substrate having many uneven sections is formed on a photovoltaic element of the present invention, and bottoms of the uneven sections on the substrate are rounded.

When the bottom of the uneven section is rounded, the thickness of the amorphous or micro crystalline silicon layer which is formed thereon can be uniform.

An amorphous or micro crystalline silicon layer of different conductivity type on a front surface of a crystalline silicon substrate of one conductivity type having many uneven sections is formed on a photovoltaic element of the present invention, and bottoms of the uneven sections on the substrate are rounded.

A substantially intrinsic amorphous or micro crystalline silicon layer is preferably interposed between the front surface of the crystalline silicon substrate of one conductivity type and the amorphous or micro crystalline silicon layer of different conductivity type.

When the bottoms of the uneven sections are rounded, the thickness of the amorphous or micro crystalline silicon layer of different conductivity type which is formed thereon can be uniform. In particular, a open circuit voltage and fill factor of a photovoltaic element having an HIT structure which improves a characteristic of the heterojunction interface by interposing the substantially intrinsic amorphous or micro crystalline silicon layer. The substantially intrinsic amorphous or micro crystalline silicon layer reduces defects at the heterojunction interface with a crystalline silicon substrate and improves the characteristic of the heterojunction interface. Thus, the layer does not affect the improvement of the heterojunction interface even when dopant is diffused on the intrinsic amorphous or micro crystalline silicon layer in the subsequent processes.

The bottom is preferably formed so as to have a curved surface of a larger curvature than that of the top of the protruded section.

Furthermore, the bottom is preferably a curved surface of which radius is larger than 0.005 μm, more preferably in the range 0.01–20 μm.

A high doping layer of one conductivity type can be formed on the back surface of the crystalline silicon substrate of one conductivity type. By providing the high doping layer of one conductivity type, a BSF-type photovoltaic element can be obtained.

A high doping layer of one conductivity type containing an amorphous or micro crystalline silicon can be formed on the back surface of the crystalline silicon substrate. A substantially intrinsic amorphous or micro crystalline silicon layer is preferably interposed between the crystalline silicon substrate and the high doping layer of one conductivity type containing an amorphous or micro crystalline silicon layer.

By using this structure, a BSF type photovoltaic element can be obtained in a low temperature process. The substantially intrinsic amorphous or micro crystalline silicon layer can reduce defects at the heterojunction interface with a crystalline silicon substrate and improve the characteristic of heterojunction interface.

An amorphous or micro crystalline silicon layer of different conductivity type on a crystalline silicon substrate of one conductivity type having many uneven sections on both front and back surface of the substrate is formed on a photovoltaic element of the present invention, and bottoms of the uneven sections are rounded.

A substantially intrinsic amorphous or micro crystalline silicon layer is preferably interposed between the crystalline silicon substrate of one conductivity type and the amorphous or micro crystalline silicon layer of different conductivity type.

The bottom is preferably formed so as to have a curved surface of a larger curvature than that of the protruded section.

Furthermore, the bottom is preferably a curved surface of which radius is larger than 0.005 $\mu$m, more preferably in the rage 0.01 to 20 $\mu$m.

The bottom is preferably formed so as to have a curved surface of a larger curvature than that of the top of protruded section.

A transparent electrode is formed on the amorphous or micro crystalline silicon layer of different conductivity type, and a comb-like collecting electrode is formed on the transparent electrode. A transparent electrode is also formed on the back surface of the substrate, and a comb-like collecting electrode is formed on the transparent electrode.

By using this structure, a warp of the substrate is prevented even when the substrate is made thinner.

In a manufacturing method of a photovoltaic elements according to the present invention, many uneven sections are formed on a crystalline silicon substrate, a surface of the substrate is isotropically etched, and bottoms of the uneven sections on the front surface of the substrate are rounded. A substantially intrinsic amorphous or micro crystalline silicon layer is formed on the front surface of the substrate, and thereon an amorphous or micro crystalline silicon layer is formed.

A substantially intrinsic amorphous or micro crystalline silicon layer is formed by depositing an intrinsic amorphous or micro crystalline silicon layer by plasma resolution using raw material gas such as silane without mixing dopant gas when forming a layer. In the subsequent processes, dopant may be diffused in the substantially intrinsic or micro crystalline silicon layer. However, the substantially intrinsic amorphous or micro crystalline silicon layer is formed so as to avoid defects at the heterojunction interface with a single crystalline silicon substrate, and the interface characteristic is improved when the layer is formed without containing dopant gas. Thus, the interface characteristic is not affected even if dopant is diffused after forming a layer.

Wet etching using a mixed solution of hydrogen fluoride and nitric acid is preferably used as isotropic etching.

Many uneven sections on the crystalline silicon substrate can be formed in a first process of cleaning a surface of the crystalline silicon substrate and a second process of processing the crystalline silicon substrate surface in an alkaline solution to form uneven sections on the surface.

In the first process, an alkaline solution of the same kind as that in the second process is preferably used.

An alkaline solution containing an interface active agent is preferably used in the second process. In the above composition, the appearance of the surface after isotropically etched does not affect the strength of the short circuit current of a photovoltaic element since the bottoms of the uneven sections are slightly rounded. And the variety of the thickness of the amorphous or micro crystalline layer is prevented, eliminating the lowered open circuit voltage and short circuit between the substrate and the electrode. Therefore, it is possible to achieve an improved output characteristic of a photovoltaic element and high yields.

THE BELIEF DESCRIPTION OF THE DRAWINGS

THE PREFERRED EMBODIMENTS OF THE INVENTION

Figure 1:
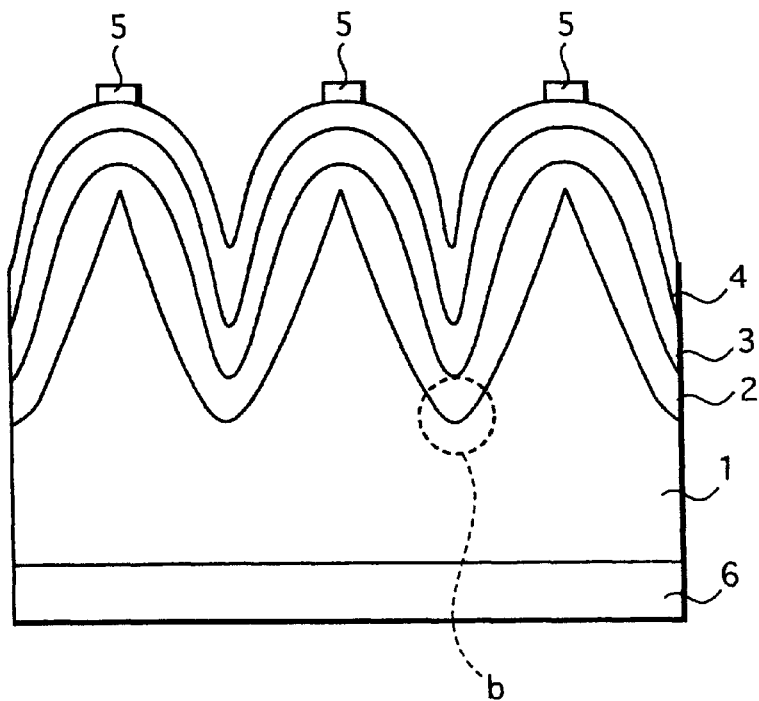
FIG. 1 is a cross sectional view illustrating a photovoltaic element according to an embodiment of the present invention.
Figure 11:
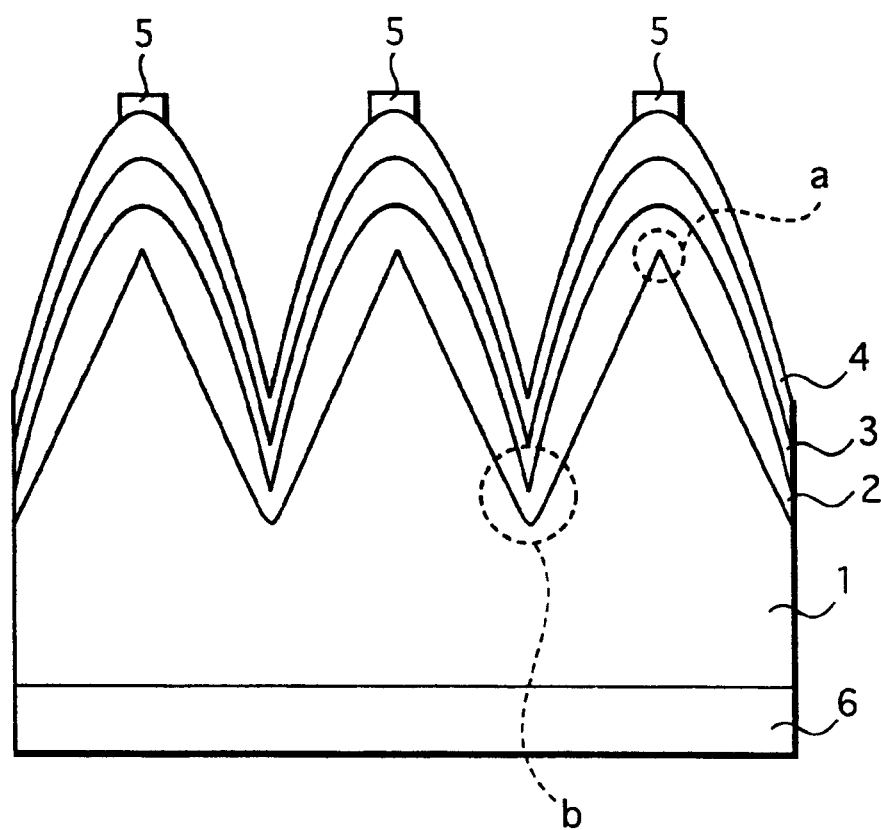
FIG. 11 is a cross sectional view illustrating a conventional photovoltaic element of an HIT structure having the optical confinement.

Detailed explanation on this invention will be made by referring to the drawings. FIG. 1 is a cross sectional view illustrating a single crystalline silicon photovoltaic element manufactured by a method according to the present invention. As like above described FIG. 11, a comb-like collecting electrode 5 is illustrated as that it is formed only on the top of a pyramid shape protruded section to help an understanding about the notion of a comb-like collecting electrode 5. Other cross sectional views according to the other embodiments illustrate the comb-like collecting electrode in the same manner as in FIG. 1.

In a photovoltaic element of the present invention, an intrinsic amorphous silicon layer 2 is formed on an n-type single crystalline. silicon substrate 1 having many uneven sections on its front surface, and a p-type amorphous silicon layer 3 is formed on the intrinsic amorphous silicon layer 2. A front electrode 4 comprising ITO is formed on the whole region of the p-type amorphous silicon layer 3 and a comb-like collecting electrode 5 comprising silver (Ag) is formed on the front electrode 4. A back electrode 6 comprising aluminum (Al) is formed on the back surface of the single crystalline silicon substrate 1.

The present invention is featured by that a bottom b of the uneven section on the front surface of the single crystalline silicon substrate 1 is rounded. As described above, an amorphous silicon layer deposited on the front surface of the silicon substrate 1 in the conventional photovoltaic element is thick at the top a of pyramid shape protruded section of the uneven section and is thin at the bottom b, causing variety in thickness of the layer. On the other hand, the present invention can achieve a uniform thickness of amorphous silicon layers 2 and 3 formed on the substrate 1 by rounding the bottom b.

In the present invention, an uneven section is formed on the substrate 1 and a bottom rounded before the amorphous silicon layer 2 is deposited on the single crystalline silicon substrate 1. That is, before depositing the amorphous silicon layers 2 and 3 by a plasma CVD method, an uneven section of a pyramid shape is formed on the front surface of the substrate 1 and its bottoms are rounded. Explanation on this process will be made as follows.

First, a method for forming an uneven section, which is most suitable for optical confinement, on the substrate 1 will be explained.

As a first step, a front surface of a substrate is cleaned for eliminating attachments on the surface and modifying deformations of a surface of a crystalline semiconductor substrate. A second step is anisotropic etching for forming an uneven structure. The deformation means a deformation in a crystalline structure in a region of as long as tens $\mu$m in depth from the front surface of the substrate generated when slicing a substrate from a single crystalline silicon ingot.

It is preferred to etch to a depth of tense $\mu$m from the front surface of the substrate since the first step is performed in order to eliminate attachments on the surface and deformations which extend as deep as tens $\mu$m from the front surface of the substrate.

It is also preferred to use an etching solution of high density to fasten the etching rate of a crystalline semiconductor since process time is required to shorten in a case of mass production.

Another reason for using an etching solution of high density is that it is necessary to increase the times of using an etching solution since the etching solution contaminated by attached subjects to the surface of the substrate may affect the etching characteristics in the present invention.

The objective of the second step is to form an uneven structure in a photovoltaic element. The most suitable uneven structure for a photovoltaic element is one having a length of 10–50 $\mu$m between tops of the uneven sections and the protruded section's vertical angle of less than 90° and this structure should be formed accurately. Therefore, it is difficult to obtain the most suitable and accurate uneven structure and reproduce it when anisotropic etching rate is too fast. Thus, the density of an etching solution is required to be relatively low.

As an etching solution used in the second process is required to isotropically etch a crystalline semiconductor substrate, alkaline solutions such as NaOH and KOH etc. are used. In use of these chemicals, it is necessary to pay attentions to maintenance of the chemicals and the durability of the equipment against etching solutions. The cost and time necessary for the maintenance of chemicals and the measures to be taken for the durability of the equipment increase as the number of chemicals used increases.

In conjunction with this, it is preferred to use the same alkaline solution in the first and second processes.

In the second process, a silicon crumb or a reactive product generated during anisotropic etching is reattached to the substrate, making the front surface of the substrate rough. To prevent this, an interface active agent or isopropyl alcohol (IPA) should be mixed in the alkaline solution.

To be concrete, many bubbles are generated on the front surface of the substrate in the process of etching the crystalline semiconductor substrate by the alkaline solution. It is expected that IPA or an interface active agent minimize the size of bubbles and facilitate the bubbles to detach from the front surface of the substrate, thereby preventing silicon crumbs or reactive products in the bubbles from reattaching to the substrate.

The effect of facilitating detachment of bubbles by the interface active agent is enhanced when the surface tension is under the predetermined value.

By such ways as oscillating the substrate up and down, supersonically oscillating the substrate, supersonically oscillating the etching solution, or bubbling the etching solution by inert gases such as nitrogen ($N_2$) or argon (Ar), the substrate is oscillated directly or indirectly, thereby the effect of bubble detachment by IPA or an interface active agent is further facilitated.

The detail embodiment of the first and second processes will be explained.

An n-type crystalline silicon substrate 1 which is sliced along (100) surface and of which resistivity is 0.1–10 $\Omega$cm and of which thickness is 200–400 $\mu$m is prepared. As a first process, the substrate 1 is dipped into 5 wt. % aqueous solution of NaOH about 85° C. for ten minutes to remove deformation on the front surface of the substrate 1 generated during the process. By this process, the deformation as deep as about 10 $\mu$m from the front surface of the substrate is removed, and a single crystalline silicon substrate of good crystallization can be obtained. The present invention uses an NaOH aqueous solution as an etching solution in the first process. This etching solution of higher density fastens etching rate and etches excessively, to form relatively moderate uneven sections on the surface of the substrate.

In the second process, the front surface of the substrate 1 is anisotropically etched by using a mixed aqueous solution of 2 wt. % of sodium hydrogen (NaOH), which is lower density than that of the first process, and isopropyl alcohol (IPA). In the second process, uneven sections of pyramid shape are formed on the surface of the substrate 1. A single crystalline silicon is anisotropically etched by an alkaline aqueous solution. The etching rate for (111) surface is extremely slower in comparison with that of the other crystal orientation. Accordingly, the single crystalline substrate 1 sliced in (100) surface is etched by a mixed aqueous solution containing 2% of NaOH and IPA to anisotropically etch the silicon along the (111) surface, and form 1–10 μm deep uniform protruded sections of pyramid shape on the front surface of the substrate 1. Therefore, recessed sections which are V-shape in cross section and are formed by four faces deposited on (111) surface are formed on the whole surface.

In the above mentioned second process, hydrogen is generated when alkali contained in the etching solution and the silicon substrate react each other. And bubbles of hydrogen attach to the front surface of the substrate. Attached bubbles make it impossible for the region attached with the bubbles to form uniform uneven sections since the region can not react with alkali. Thus, an IPA aqueous solution is mixed in an alkali aqueous solution in order to prevent bubbles from attaching to the surface.

Since IPA is volatile, it is necessary to control strictly the density of IPA and supply it in the second process.

An interface active agent can substitute for the above mentioned IPA in order to prevent hydrogen generated in the second process from attaching to the front surface of the substrate. For example, in this second process, an etching solution in which an interface active agent is added in the ratio of about 1 wt. % into about 1.5 wt. % aqueous solution of NaOH is used. The above mentioned etching to form uneven sections as in the case of IPA can be performed by dipping the substrate into the above etching solution of about 85° C. for 30 minutes. The interface active agent is not volatile, therefore, it is not necessary to supply the interface active agent or control its density, resulting in easier process.

In this embodiment, Sintrex by Nippon Oil and Fat Co. Ltd. is used although other interface active agent can also be used.

By the first and second processes of this embodiment, uneven sections of pyramid shape which is 5 μm in width and 5 μm in depth (height) and is most suitable to achieve optical confinement can be formed on the front surface of the substrate.

When manufacturing 100 units of substrates having uneven sections by the above first and second processes, it has not been necessary to replace an etching solution through the first and second processes.

Next, bottoms b are rounded after uneven sections are formed on the substrate 1. After cleaning the substrate 1 having the uneven sections with isonized water, the substrate is dipped into a hydrogen fluoride aqueous solution mixing hydrogen fluoride (HF) and water ($H_2O$) in the ratio 1:100 to remove the oxide film on the front surface of the substrate, and is cleaned with water.

Then, the substrate 1 is dipped into an aqueous solution mixing ammonia ($NH_4OH$), hydrogen peroxide ($H_2O_2$), and water ($H_2O$) in the ratio 1:1:5 to oxide the silicon surface by catching particles and organic materials on the front surface of the substrate, and the substrate is cleaned with water. Further, the substrate 1 is dipped into a hydrogen fluoride aqueous solution mixing hydrogen fluoride and water in the ratio 1:100 to remove the oxide layer on the front surface of the substrate, and is cleaned with water, thus removing particles and organic materials on the front surface of the substrate.

Next, the substrate 1 is dipped into an aqueous solution mixed 35% hydrochloric acid (HCl), 30% hydrogen peroxide ($H_2O_2$), and water ($H_2O$) in the ratio 1:1:6 to oxide the front surface of the substrate by catching heavy metals such as aluminum, iron, and magnesium and alkaline component such as sodium which have negative effects on solar cell characteristics. Then the substrate is dipped into a hydrogen fluoride solution mixing hydrogen fluoride and water in the ratio 1:100 to remove the oxide layer on the front surface of the substrate, and is cleaned by water, thus removing the heavy metals on the front surface of the substrate.

Further, the substrate 1 is dipped into an aqueous solution mixing hydrogen fluoride (HF) and nitric acid ($HNO_3$) in the ratio 1:20 for about 30 seconds to eliminate the front surface of the substrate about 2 μm in depth by isotropically etching. The bottom of the uneven section on the front surface of the substrate is rounded by the isotropic etching. After the isotropic etching, the substrate is cleaned with water and dipped into a hydrogen fluoride aqueous solution mixing hydrogen fluoride and water in the ratio 1:100 to eliminate the oxide layer on the front surface of the substrate, and is cleaned with water.

After processing the surface of the substrate 1, the surface of the substrate 1 is processed by $H_2$ plasma. Further an intrinsic amorphous silicon layer 2 of 50 to 200 Å in thick is deposited by a plasma CVD method using silane ($SiH_4$), and a p-type amorphous silicon layer 3 of 50–200 Å in thick is deposited on the intrinsic amorphous silicon layer 2 to form a p-n junction by using silane ($SiH_4$) and diborane ($B_2H_6$) as dopant gas.

Further, a front electrode 4 containing ITO of 1000 Å in thick is formed by sputtering and a comb-like collecting electrode 5 containing silver of 10 μm in thick is formed by sputtering. A back electrode 6 containing aluminum of 2 μm in thick is formed on the back surface of the substrate 1 by vacuum deposition. By these processes, a photovoltaic element of the present invention can be obtained.

Figure 2:
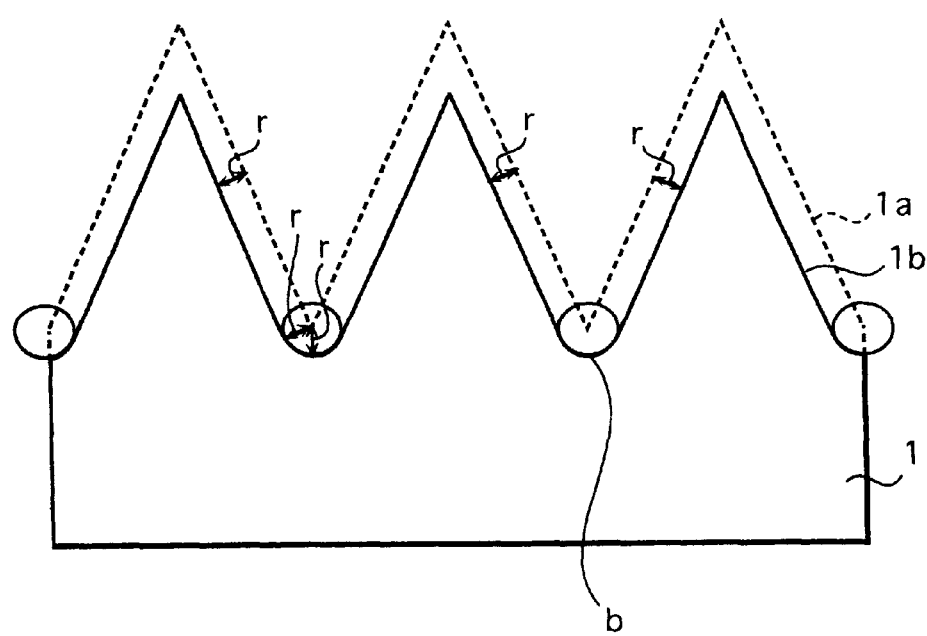
FIG. 2 is a schematic view illustrating isotropic etching performed in the present invention.

In the meantime, although the intrinsic amorphous silicon layer 2 is interposed in the above photovoltaic element to improve hetrojunction interface characteristics between the single crystalline silicon substrate 1 and the p-type amorphous silicon layer 3, p-type dopant may be diffused in the intrinsic amorphous silicon layer 2 during formation of the p-type amorphous silicon layer 3 and heat treatment thereafter. Since the intrinsic amorphous silicon layer 2 is formed to reduce defects at the heterojunction interface, the junction interface characteristic is not affected by diffusion of p-type dopant in the subsequent processes. As shown in FIG. 2, the above isotropic etching is performed for predetermined etching time to etch the front surface 1a of the substrate 1 as deep as r. When the front surface of the substrate becomes 1b, a curved surface, of which radius is r and of which center is the bottom of the pre-etched substrate, is formed.

The intrinsic amorphous silicon layer 2 in the photovoltaic element of an HIT structure should be more than 50 Å (0.005 μm) in thick. Accordingly, in order to form amorphous silicon layer of uniform and satisfying thickness, a curved surface of 50 Å in thick is necessary at the bottom. When a curved surface is less than 50 Å in radius, it may cause various thickness of the amorphous silicon layers 2 and 3. Therefore, the radius of the curved surface at the bottom b should be more than 50 Å.

Figure 3:
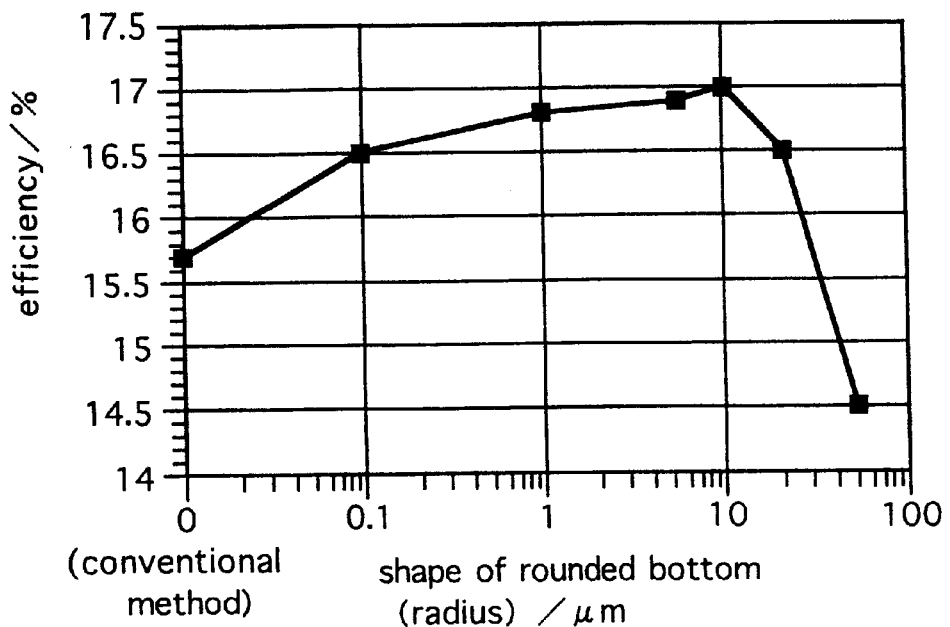
FIG. 3 illustrates a relation between the bottom shape of the uneven section on the substrate and the conversion efficiency.

By isotropic etching, the surface of the substrate 1 can be etched to make its front surface plain rather than pyramid shape. FIG. 3 shows the results of conversion efficiency of photovoltaic elements different in isotropic etching times and radius of curvature at bottoms b from one another. From FIG. 3, it is found that the best radius of curvature of round shape at bottom is in the range of 0.01–20 μm.

A photovoltaic element formed by the method of the present invention and a photovoltaic element which is formed by the same method except that only uneven section of pyramid shape is formed on a substrate 1 and isotropic etching is not performed and are prepared. The photovoltaic characteristics of them are measured under the solar simulator of which brightness is AM 1.5, 100 mW/m$^2$. The results are in Table 1.

TABLE 1

| | Voc (V) | Isc (A) | F.F. | η (%) |
|---|---|---|---|---|
| Present invention | 0.65 | 3.49 | 0.75 | 17.0 |
| Conventional example | 0.62 | 3.52 | 0.72 | 15.7 |

As shown in Table 1, the photovoltaic element of the present invention improves an open circuit voltage (Voc) 5%, a fill factor (F.F.) 4%, and a conversion efficiency (η) 8% as compared with the conventional photovoltaic element. This is due to a round shape of bottoms of pyramid structure in the photovoltaic element of the present invention by isotropic etching. Thus, the variety in the thickness of the amorphous silicon layer laminated on the silicon substrate is reduced and unequal electric field strength short circuit in a front electrode and silicon substrate do not occur.

The same effect can be obtained when the front surface of the substrate 1 is uneven structure of line- or lattice-shape.

In the above embodiment, a mixed solution of hydrogen fluoride and nitric acid is used for isotropic etching. Other isotropic etching such as wet etching using a mixed solution of $HF/HNO_3/CH_3COOH$ or dry etching using $CF_3/O_2$ gas are also applicable.

Although the comb-like collecting electrode 5 is formed by sputtering and the back electrode is by vacuum deposition in the above embodiment, the comb-like collecting electrode 5 can be formed by screen printing using Ag paste and the back electrode 6 can be formed by screen printing using Al paste.

Since calcination temperature for Ag paste is about 200° C., the comb-like collecting electrode 5 can be formed by screen-printing Ag paste after forming the amorphous silicon layers 2 and 3 and the front electrode 4 on the substrate and calcinating them. Al paste, of which calcination temperature is about 700° C., can not be calcinated after forming the amorphous silicon 2 and 3 in conjunction with heat treatment. Thus, when using Al paste as the back electrode 6, Al paste is printed and calcinated on the whole back surface of the substrate 1 before forming an amorphous silicon layer to form the back electrode 6. Then, the amorphous silicon layers 2 and 3 and the front electrode 4 and the comb like collecting electrode 5 can be formed.

Figure 4:
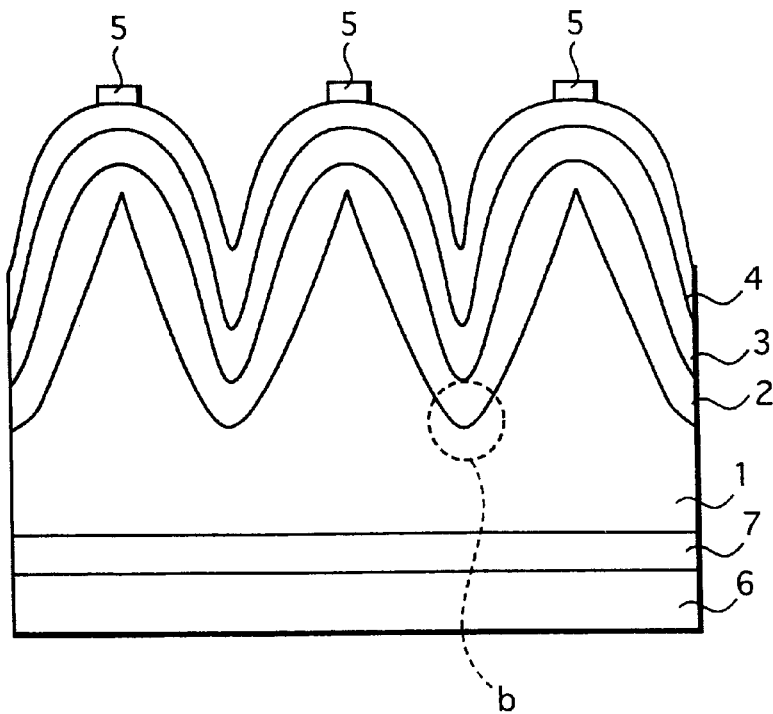
FIG. 4 is a cross sectional view illustrating a photovoltaic element according to a second embodiment of the present invention.

FIG. 4 is a cross sectional view illustrating the second embodiment of the present invention. In this embodiment, a BSF (Back Surface Field) type photovoltaic element in which an internal electric field is introduced on the back surface of the substrate 1 to prevent an effect from the recombination of carriers near the back surface of the substrate 1. An n-type high doping layer 7 is formed on the back surface of the n-type substrate 1 as in FIG. 4.

The photovoltaic element in FIG. 4 can be formed by the following processes for example. An n-type crystalline silicon substrate 1 which is sliced along (100) surface and of which resistivity is 0.1–10 Ωcm and of which thickness is 200–400 μm is prepared. As a first process, the substrate 1 is dipped into a 5 wt. % aqueous solution of sodium hydroxide (NaOH) about 85° C. for ten minutes to remove deformation on the surface of the substrate 1. As a second process, the substrate 1 is dipped into a mixed solution containing 1.5 wt. % aqueous solution of NaOH, lower density than that of the first process, which is added 1 wt. % of an interface active agent. In the second process, uneven sections of pyramid shape are formed on the front surface of the substrate 1 by anisotropic etching.

Further, phosphorus (P) is diffused for 15–20 minutes under about 550° C. by using $POCl_3$ gas to form an n-type layer about 0.5 μm in depth in peripheral of the substrate.

After cleaning with water, the substrate 1 is dipped into an hydrogen fluoride aqueous solution mixing hydrogen fluoride (HF) and water ($H_2O$) in the ratio 1:100 to remove the oxide layer on the front surface of the substrate and is cleaned with water.

Then, the substrate 1 is dipped into an aqueous solution mixing ammonia ($NH_4OH$), hydrogen peroxide ($H_2O_2$), and water ($H_2O$) in the 1:1:5 ratio to oxide the silicon surface by catching particles and organic materials on the front surface of the substrate, and the substrate is cleaned with water. Further, the substrate is dipped into a hydrogen fluoride solution mixing hydrogen fluoride and water in the 1:100 ratio to remove the oxide layer on the surface of the substrate, and is cleaned with water in order to remove particles and organic materials on the front surface of the substrate.

Next, the substrate 1 is dipped into an aqueous solution mixing 35% hydrochloric acid (HCl) and 30% hydrogen peroxide ($H_2O_2$) and water ($H_2O$) in the 1:1:6 ratio to oxide the front surface of the substrate by catching heavy metals such as aluminum, iron, and magnesium and alkaline component such as sodium which are attached to the front surface of the substrate and have negative effects on solar cell characteristics. Then the substrate 1 is dipped into a hydrogen fluoride solution mixing hydrogen fluoride and water in the 1:100 ratio to remove the oxide layer on the front surface of the substrate, and is cleaned with water, thus removing the heavy metals on the front surface of the substrate.

Further, after coating the back surface of the substrate 1 with resist etc., the substrate 1 is dipped into an aqueous solution mixing hydrogen fluoride (HF) and nitric acid ($HNO_3$) in the 1:20 ratio for about 30 seconds to remove the front surface of the substrate about 2 μm in depth by isotropic etching. The bottom b of the uneven section on the front surface of the substrate is rounded and an n-layer on the front and side surfaces of the substrate is removed by the isotropic etching, obtaining an n-type high doping layer 7 only on the back surface of the substrate 1.

After isotropically etched, the substrate is cleaned with water and dipped in a hydrogen fluoride aqueous solution mixing hydrogen fluoride and water in the 1:100 ratio to remove the oxide layer on the surface of the substrate. Then the substrate is cleaned with water.

After the process of the surface of the substrate 1, an intrinsic amorphous silicon layer 2 and a p-type amorphous silicon layer 3 are deposited by a plasma CVD method as described in the above embodiment to form a p-n junction. A front electrode 4 containing ITO of 1000 Å in thick is formed by sputtering and a comb-like collecting electrode 5 containing silver is formed by screen printing using Ag paste thereon. Further, a back electrode 6 containing aluminum of 2 μm in thick is formed by vacuum deposition on an n-type high doping layer 7 disposed on the back surface of the substrate 1. By these processes, a BSF-type photovoltaic element can be obtained.

When forming a back electrode 6 by screen printing using Al paste, as described in the above description, a back electrode 6 is formed on the back surface of the substrate 1 before an amorphous silicon layer and so on are formed.

Figure 5:
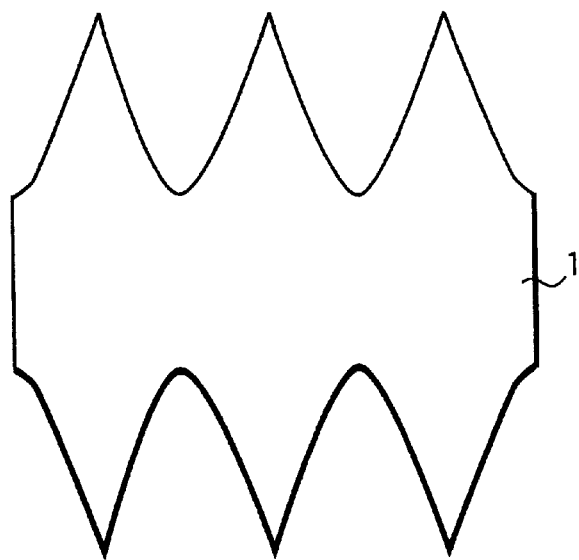
FIG. 5 is a cross sectional view illustrating a substrate which is etched.

The above embodiments is described as that the uneven sections are formed only on the front surface of the substrate 1. Some measures such as mask against the back surface of the substrate 1 should be taken so as not to be formed uneven sections by etching, otherwise as shown in FIG. 5, uneven sections having rounded bottoms are formed on both front and back surfaces of the substrate 1 by etching.

Figure 6:
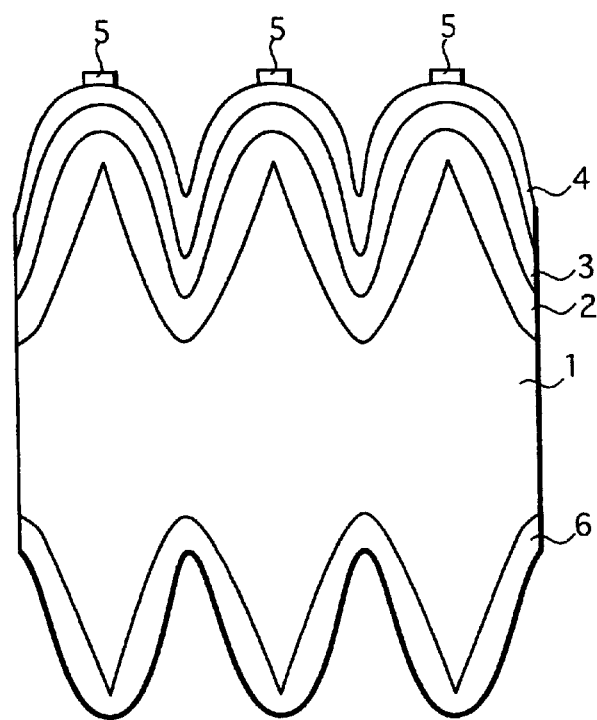
FIG. 6 is a cross sectional view illustrating a photovoltaic element according to a third embodiment of the present invention.

As shown in FIG. 6 of the third embodiment, an intrinsic amorphous silicon layer 2 and a p-type amorphous silicon layer 3 are formed on the front surface of the substrate 1 having uneven sections by a plasma CVD method. A front electrode 4 containing ITO of 1000 Å in thick is formed by sputtering on the p-type amorphous silicon layer 3. A comb-like collecting electrode 5 containing silver is formed by screen printing using Ag paste on the front electrode 4. A back electrode 6 of about 20–25 μm in thick is formed on the back surface of the substrate 1 by using Al paste.

It is convenient to form a back electrode 6 on the whole back surface of the substrate 1 by screen printing using Al paste from the viewpoint of mass production. In this method, a back electrode 6 containing Al of about 20 μm in thick is formed by pasting Al paste on the whole back surface of the substrate 1 by screen printing and calcinating the paste by approximately 700° C. heat treatment.

Recently, in the meanwhile, the substrate has become thinner and thinner in order to reduce the cost for materials. In conjunction with this, the substrate 1 warps due to the difference of coefficients of thermal expansion between Al and silicon in the heat treatment for calcinating paste. Because of the warps the substrate 1 may break in the subsequent processes, resulting in decrease of yields.

Figure 7:
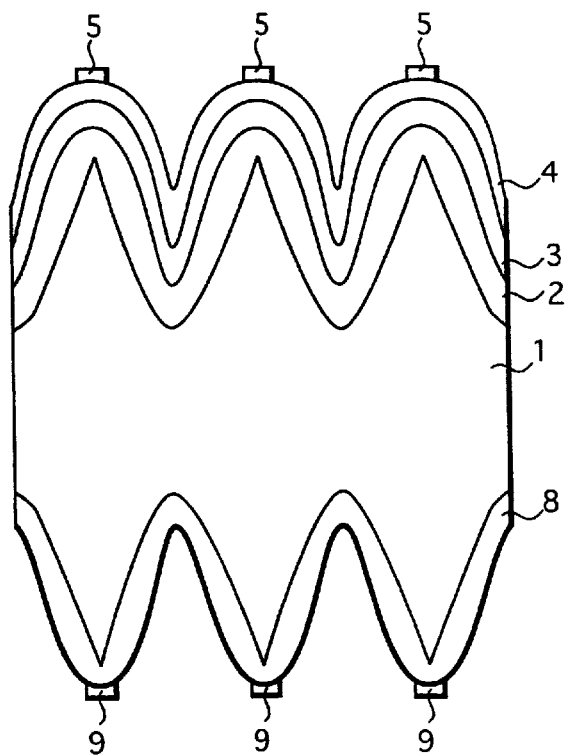
FIG. 7 is a cross sectional view illustrating a photovoltaic element according to a forth embodiment of the present invention.

FIG. 7 of the forth embodiment illustrates a photovoltaic element in which a substrate 1 does not warp up while its thickness is smaller. A transparent electrode 8 containing ITO as like as on the front surface of the substrate 1 is formed on the back surface of the substrate 1. A comb-like collecting electrode 9 is formed on the transparent electrode 8 by screen printing using Ag paste. On the front surface of the substrate 1, the comb-like collecting electrode 5 is also formed on the transparent electrode 4 containing ITO.

The comb-like collecting electrodes 5 and 9 having the same shape are formed on both front and back surface of the substrate 1 respectively through the transparent electrodes 4 and 8. Thus, the concentration of stress in a certain direction can be eliminated and warps of the substrate 1 can be prevented.

Figure 8:
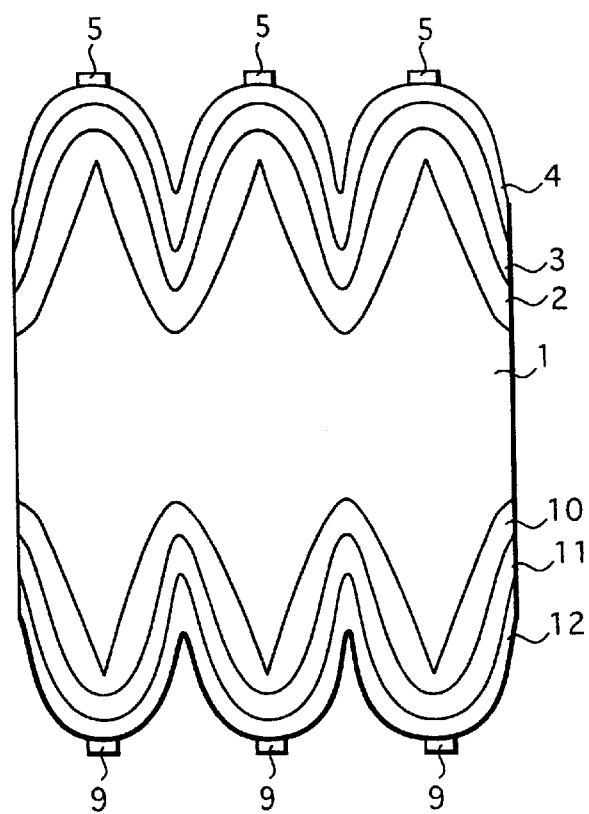
FIG. 8 is a cross sectional view illustrating a photovoltaic element according to a fifth embodiment of the present invention.

FIG. 8 of the fifth embodiment illustrates a BSF-type photovoltaic element manufactured in a low-temperature process without using thermal diffusion. An intrinsic amorphous silicon layer 10 of 50–100 Å in thick is deposited on the back surface of the substrate 1 by a plasma CVD method of low-temperature process using silane ($SiH_4$) where the temperature of the substrate is about 170° C. A high doping n-type amorphous silicon layer 11 of 50–500 Å in thick is deposited on the intrinsic amorphous silicon layer 10 by using silane ($SiH_4$) and phospine ($PH_3$)as a dopant gas. A transparent electrode on a back surface 12 containing ITO of 1000 Å in thick is formed by sputtering. A comb-like collecting electrode 9 is formed on the transparent electrode on a back surface 12 by using Ag paste. By these processes, a substantially intrinsic amorphous silicon is interposed between the crystalline silicon substrate and the amorphous silicon layer on the back surface in order to reduce defects at their interface and improve the characteristic of the heterojunction interface. As a result, a BSF structure can be obtained by a low-temperature process without using a thermal diffusion method.

In this embodiment, n-type dopant may be diffused on the intrinsic amorphous silicon layer 10 in the subsequent processes. The intrinsic amorphous silicon layer 10 is formed for improving the characteristics of the heterojunction interface as described in the above embodiment. Thus, the diffusion of dopant thereafter does not affect the interface characteristics.

Explanation will be made on an embodiment where the density of an alkaline solution included in the etching solutions used in the second process is varied.

In this embodiment, after the first process, a substrate having uneven sections is manufactured by varying the density of NaOH used in the second process within the range of 0.1–10 wt. %. By using these substrates, a photovoltaic element is formed through the same processes as those in the first embodiment to compare their characteristics of photovoltaic conversion.

Figure 9:
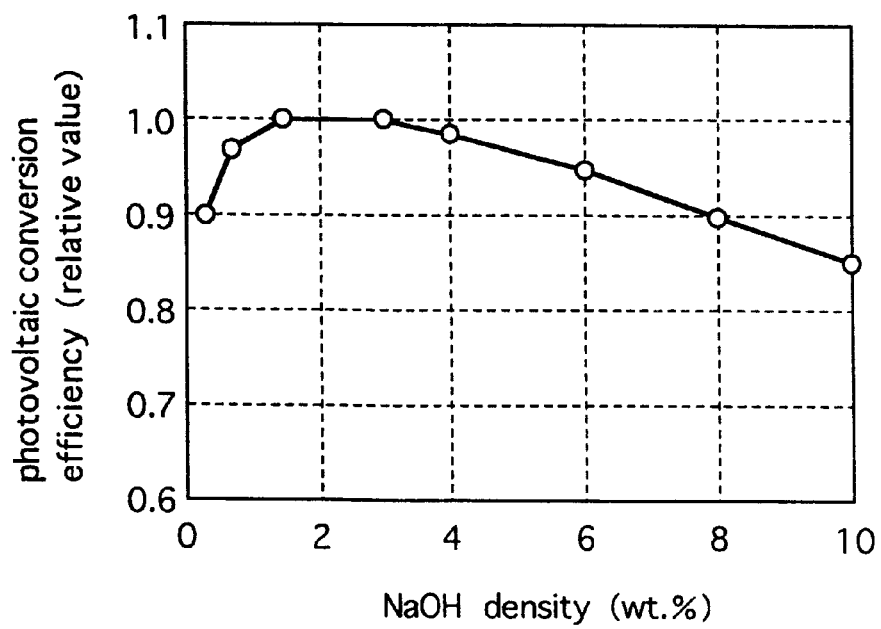
FIG. 9 is a characteristic diagram describing a relation between the density of NaOH used in the second process for forming an uneven section on a substrate in the present invention and the photoelectric conversion characteristic of a photovoltaic element.

FIG. 9 is a diagram showing the relation between the NaOH density used in the second process and the characteristic of photovoltaic conversion of the photovoltaic element. FIG. 9 shows relative values when a value of the photovoltaic element having the most effective conversion efficiency is one. It is found that high characteristics of photovoltaic conversion can be obtained when the NaOH density is 0.1–8 wt. %, in particular 1.5–3 wt. %.

When KOH is used instead of NaOH, high photovoltaic conversion characteristics can be obtained at the KOH density of 3–6 wt. %.

Further, explanations will be made on an embodiment where the surface tension of interface active agents used in the second process of this invention is varied.

Figure 10:
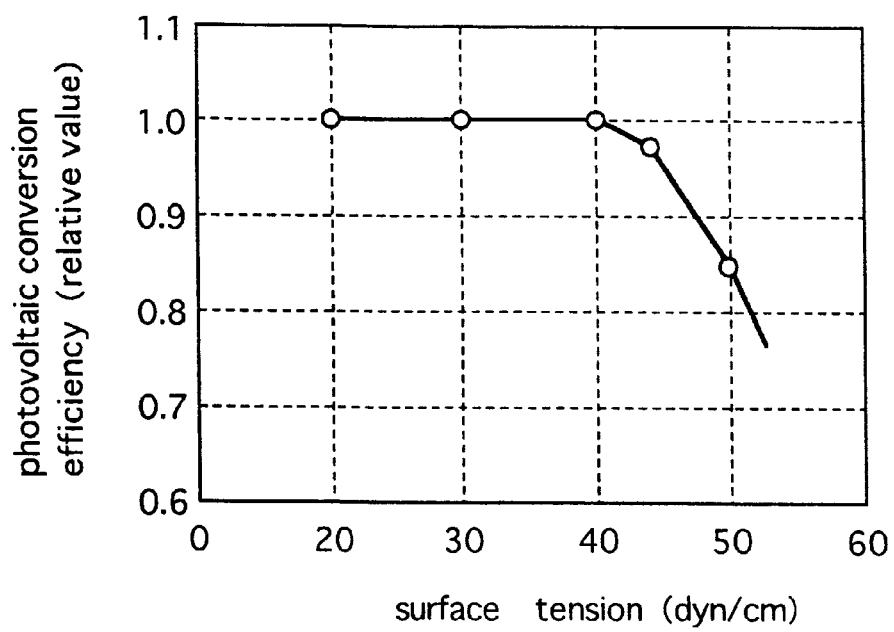
FIG. 10 is a characteristic diagram describing a relation between the surface tension of an interface active agent used in the second process for forming an uneven section on a substrate in the present invention and the photoelectric conversion characteristic of a photovoltaic element.

FIG. 10 is a characteristic diagram showing a relation between the surface tension of an interface active agent and photovoltaic conversion characteristic of a photovoltaic element. FIG. 10 shows relative values when a value of the photovoltaic element having the most effective conversion efficiency is one. It is found that a solar cell having high characteristics of photovoltaic conversion can be obtained when the surface tension of the interface active agent is less than 47 dyn/cm, in particular less than 40 dyn/cm.

The reason for the improvement of photovoltaic conversion characteristics by reducing the surface tension of the interface active agent is considered as follows.

In the second process, hydrogen is generated when alkali contained in the etching solution and silicon substrate react each other. The bubbles of hydrogen attach to the surface of the substrate. Adhesiveness of the etching solution to the substrate becomes grater when the surface tension of the interface active agent is smaller, making the bubbles which do not become larger detach from the surface of the substrate.

On the contrary, when the surface tension of the interface active agent is great, adhesiveness of the etching solution to the substrate becomes great, preventing the bubbles from detaching before the bubbles become larger. When the bubbles attach to the surface of the substrate until they become large, the sections attached by the bubbles can not react to alkali, thus uneven sections can not be obtained uniformly.

When the surface tension of the interface active agent is less than 47 dyn/cm, the detachment of bubbles form the substrate can be facilitated and the uniform texture can be formed on the whole surface of the substrate, achieving high photovoltaic conversion characteristics.

In this embodiment, controls of the surface tension are made by varying the density of an interface active agent. Table 2 shows the relative relation between the density of the interface active agent and the surface tention. It is found that the surface tension becomes less than 47 dyn/cm when the density of the interface active agent is less than 1 wt. %. In this examination, the surface tension can not be less than 20 dyn/cm. Table 2

TABLE 2

| Density of interface active agent (%) | 0.1 | 0.5 | 2 | 5 | 20 | 40 |
|---|---|---|---|---|---|---|
| Surface tension (dyn/cm) | 56 | 50 | 46 | 40 | 30 | 20 |

As described above, in this invention, since the first process for cleaning the surface of the substrate is performed before the second process, deformations created on the surface of the substrate which is sliced from an ingot can certainly be eliminated, and at the same time attachment on the surface of the substrate can also be removed. Thus, a substrate having uniform and most suitable uneven sections can be manufactured repeatedly. And a photovoltaic element of high photovoltaic conversion efficiency can be accurately reproduced by using a substrate manufactured by this invention.

Although the above description does not mention, by such ways as oscillating a substrate down and up, supersonically oscillating a substrate, supersonically oscillating an etching solution, and bubbling an etching solution by inert gas such as $N_2$ and Ar, a substrate can be oscillated directly or indirectly, thus facilitating the detachment of bubbles by the interface active agent.

Although the above embodiments are about a single crystalline silicon substrate, the present invention is applicable to a polycrystalline silicon substrate. The above mentioned first and second processes are applicable to a crystalline semiconductor substrate in general such as single- and poly-crystalline Germanium based substrate.

In this embodiment, an intrinsic amorphous silicon layer is interposed between a single crystalline silicon substrate and a p- or n-type amorphous silicon layer. The present invention is also applicable when a p- or n-type amorphous silicon layer is formed directly on a single crystalline silicon substrate. In such a case, uniform thickness of the amorphous silicon layer formed on the substrate can be obtained when bottoms of uneven sections on the substrate are rounded.

As described, in this invention, bottoms of many uneven sections on the surface of the substrate are etched by isotropic etching and are made round, to reduce variety of the thickness of amorphous silicon layer deposited thereon. Thus, an open circuit voltage and a fill factor of the photovoltaic element are improved and its output can increase.

What is claimed is:

1. A photovoltaic element in which a crystalline silicon substrate having many uneven sections of pyramid shape formed on the front surface of the substrate by anisotropic etching and an amorphous or micro crystalline silicon layer formed on the uneven sections by a CVD method are deposited, wherein the bottoms of said uneven sections of pyramid shape which are formed on the front surface of the substrate are rounded.

2. The photovoltaic element according to claim 1, wherein said bottom has a curved surface of a larger curvature than that of the top of the protruded section.

3. The photovoltaic element according to claim 2, wherein said bottom is a curved surface of which radius is larger than 0.005 $\mu$m.

4. The photovoltaic element according to claim 2, wherein said bottom is a curved surface of which radius is in the range 0.01–20 $\mu$m.

5. The photovoltaic element according to claim 1, wherein a high doping layer of one conductivity type is formed on the back surface of said crystalline silicon substrate of one conductivity type.

6. The photovoltaic element according to claim 5, wherein a high doping layer of one conductivity type containing an amorphous or micro crystalline silicon is formed on the back surface of said crystalline silicon substrate.

7. The photovoltaic element according to claim 6, wherein a substantially intrinsic amorphous or micro crystalline silicon layer is interposed between said crystalline silicon substrate and said high doping layer of one conductivity type.

8. A photovoltaic element in which a crystalline silicon substrate of one conductivity type having many uneven sections of pyramid shape formed on the front surface of the substrate by anisotropic etching and an amorphous or micro crystalline silicon layer of different conductivity type formed on the front surface of the substrate by a CVD method are deposited, wherein bottoms of said uneven sections of pyramid shape which are formed on the front surface of the substrate are rounded.

9. The photovoltaic element according to claim 8, wherein a substantially intrinsic amorphous or micro crystalline silicon layer formed by a CVD method is interposed between said crystalline silicon substrate of one conductivity type on which front surface are formed many uneven sections of pyramid shape and said amorphous or micro crystalline silicon layer of different conductivity type.

10. The photovoltaic element according to claim 8 or 9, wherein said bottom has a curved surface of a larger curvature than that of the top of the protruded section.

11. The photovoltaic element according to claim 10, wherein said bottom is a curved surface of which radius is larger than 0.005 $\mu$m.

12. The photovoltaic element according to claim 8, wherein said bottom is a curved surface of which radius is in the range 0.01–20 $\mu$m.

13. A photovoltaic element in which a crystalline silicon substrate of one conductivity type having many uneven sections of pyramid shape on both front and back surfaces of the substrate by anisotropic etching and an amorphous or micro crystalline silicon layer or different conductivity type formed on both front and back surfaces of the substrate by a CVD method are deposited, wherein bottoms of said uneven sections of pyramid shape are formed on both front and back surfaces of the substrate are rounded.

14. The photovoltaic element according to claim 13, wherein a substantially intrinsic amorphous or micro crystalline silicon layer formed by a CVD method is interposed between said upper crystalline silicon substrate of one conductivity type and having many uneven sections of pyramid shape on both front and back surfaces of the substrate and said amorphous or micro crystalline silicon layer of different conductivity type.

15. The photovoltaic element according to claim 13 or 14, wherein said bottom has a curved surface of a larger curvature than that of the top of the protruded section.

16. The photovoltaic element according to claim 15, wherein said bottom is a curved surface of which radius is larger than 0.005 μm.

17. The photovoltaic element according to claim 15, wherein said bottom is a curved surface of which radius is in the rage 0.01–20 μm.

18. The photovoltaic element according to claims 13, wherein a transparent electrode is formed on said amorphous or micro crystalline silicon layer of different conductivity type, a comb-like collecting electrode is formed on the transparent electrode, a transparent electrode is also formed on the back surface of the substrate, and a comb-like collecting electrode is formed thereon.

19. The photovoltaic element according to claim 18, wherein a high doping layer of one conductivity type is formed on the back surface of said crystalline silicon substrate of one conductivity type.

20. The photovoltaic element according to claim 18, wherein a high doping layer of one conductivity type containing an amorphous or micro crystalline silicon is formed on the back surface of said crystalline silicon substrate.

21. The photovoltaic element according to claim 20, wherein a substantially intrinsic amorphous or micro crystalline silicon layer is interposed between said crystalline silicon substrate and said high doping layer of one conductivity type.

* * * * *